US012334528B2

(12) United States Patent
Azzouz et al.

(10) Patent No.: US 12,334,528 B2
(45) Date of Patent: Jun. 17, 2025

(54) DEVICE FOR THERMALLY REGULATING AN ELECTRICAL COMPONENT

(71) Applicant: Valeo Systemes Thermiques, Le Mesnil Saint-Denis (FR)

(72) Inventors: Kamel Azzouz, Le Mesnil Saint Denis (FR); Amrid Mammeri, Le Mesnil Saint Denis (FR)

(73) Assignee: Valeo Systemes Thermiques, Le Mesnil Saint-Denis (FR)

( * ) Notice: Subject to any disclaimer, the term of this patent is extended or adjusted under 35 U.S.C. 154(b) by 416 days.

(21) Appl. No.: 17/786,946

(22) PCT Filed: Dec. 7, 2020

(86) PCT No.: PCT/FR2020/052314
§ 371 (c)(1),
(2) Date: Jun. 17, 2022

(87) PCT Pub. No.: WO2021/123554
PCT Pub. Date: Jun. 24, 2021

(65) Prior Publication Data
US 2023/0387496 A1      Nov. 30, 2023

(30) Foreign Application Priority Data
Dec. 20, 2019   (FR) ...................................... 1915327

(51) Int. Cl.
*H05K 7/20* (2006.01)
*H01M 10/625* (2014.01)
(Continued)

(52) U.S. Cl.
CPC ..... *H01M 10/6551* (2015.04); *H01M 10/625* (2015.04); *H01M 10/6569* (2015.04);
(Continued)

(58) Field of Classification Search
None
See application file for complete search history.

(56) References Cited

U.S. PATENT DOCUMENTS 5,907,473 A * 5/1999 Przilas ............... H05K 7/20345
174/15.1
5,943,211 A * 8/1999 Havey ................... H01L 25/105
174/15.1

FOREIGN PATENT DOCUMENTS

CN    106784441 A    5/2017
EP    3544107 A1    9/2019
(Continued)

OTHER PUBLICATIONS

International Search Report and Written Opinion in corresponding International Application No. PCT/FR2020/052314, mailed Apr. 20, 2021 (11 pages).

*Primary Examiner* — Mukundbhai G Patel
(74) *Attorney, Agent, or Firm* — Osha Bergman Watanabe & Burton LLP

(57) ABSTRACT

A device (1) for thermally regulating an electrical component (3, 31), the temperature of which needs to be regulated, said electrical or electronic component (3, 31) being liable to release heat during its operation, the thermal regulation device (1) having a housing (27) that is configured to accommodate the electrical or electronic component (3, 31), a circuit (43) and a device (45) for spraying a dielectric fluid, the phase-change temperature of which is such that it is able to vaporize on contact with the electrical or electronic component (3, 31), the housing (27) having at least one wall (5) for condensation of the dielectric fluid in its vaporized form, at least one external face (7) and/or internal face (9) of said condensation wall (5) having at least reliefs (11) configured to promote the condensation of the dielectric fluid in the vaporized state.

9 Claims, 6 Drawing Sheets

(51) Int. Cl.
*H01M 10/6551* (2014.01)
*H01M 10/6569* (2014.01)
*H01M 50/209* (2021.01)

(52) U.S. Cl.
CPC ............ *H01M 50/209* (2021.01); *H05K 7/20* (2013.01); *H05K 7/208* (2013.01)

(56) References Cited

FOREIGN PATENT DOCUMENTS

| FR | 3077683 A1 | 8/2019 |
| WO | 2018/163180 A1 | 9/2018 |
| WO | 2019/077902 A1 | 4/2019 |
| WO | 2019/221237 A1 | 11/2019 |

* cited by examiner

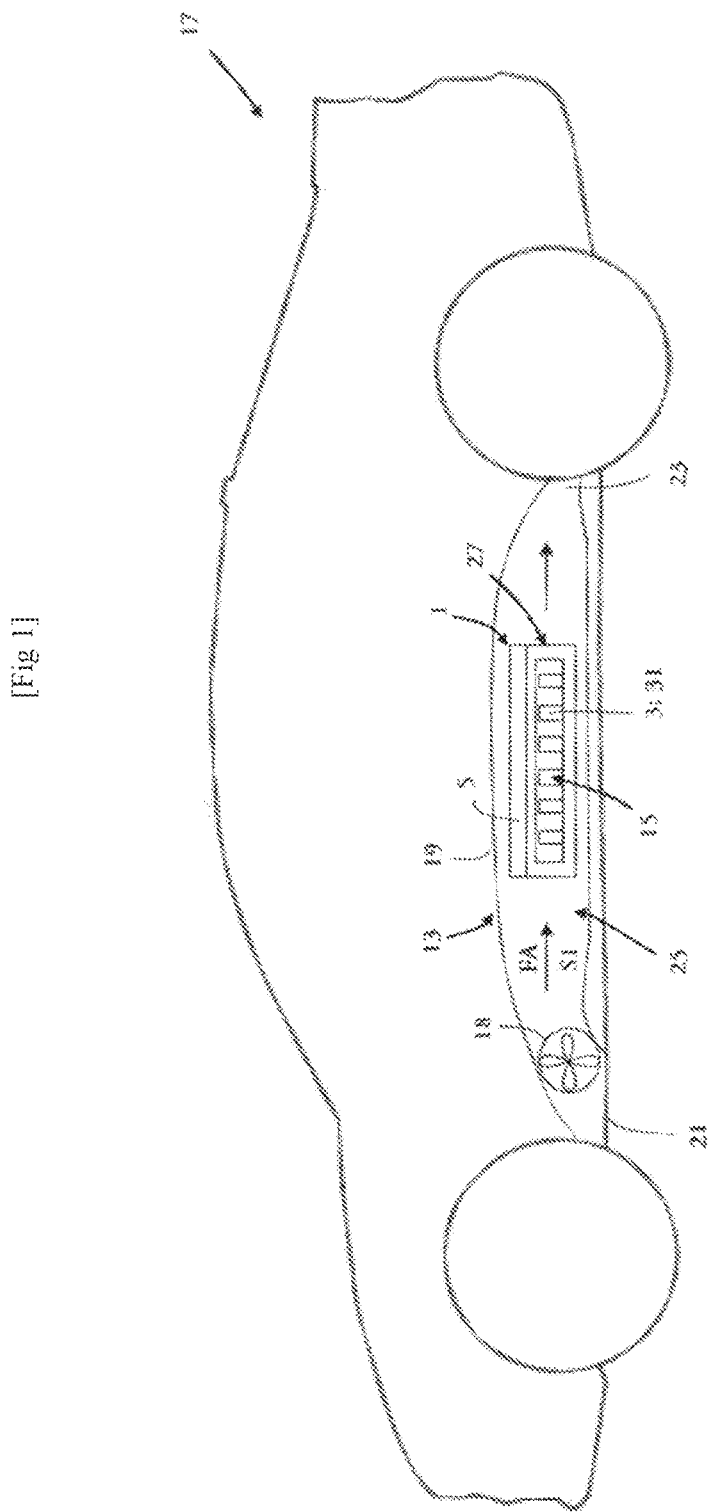

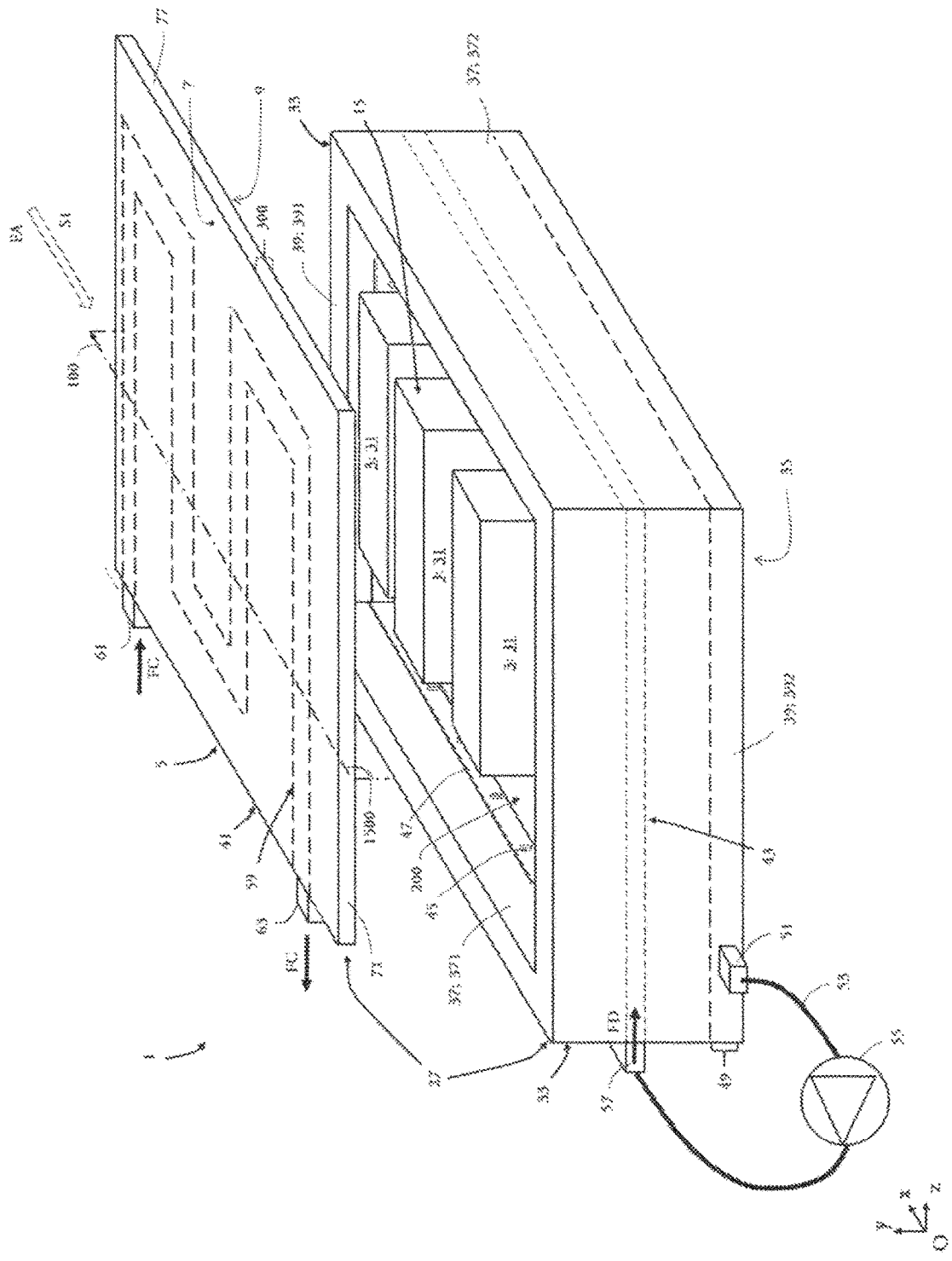
[Fig 2]

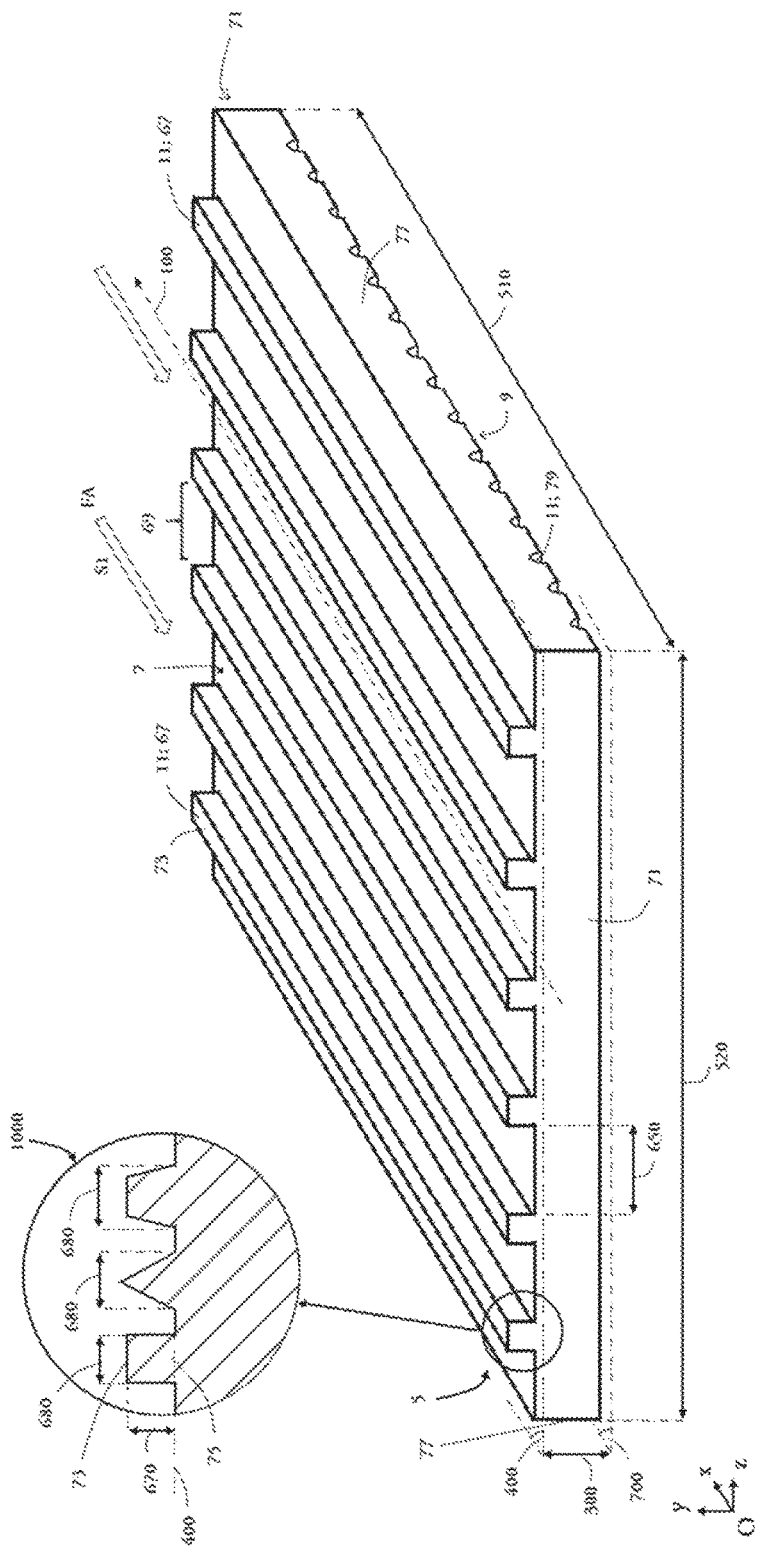
[Fig 3]

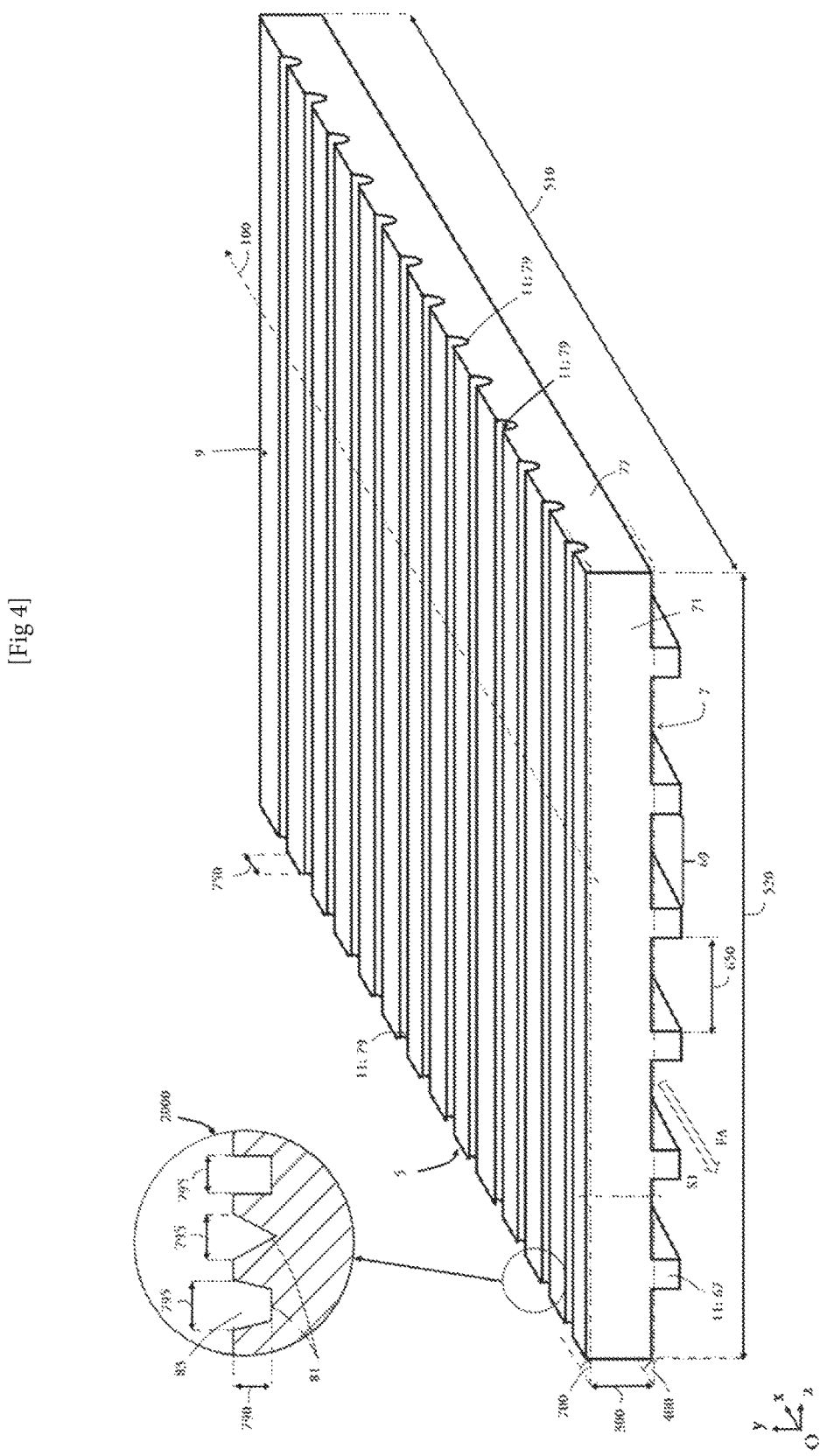
[Fig 4]

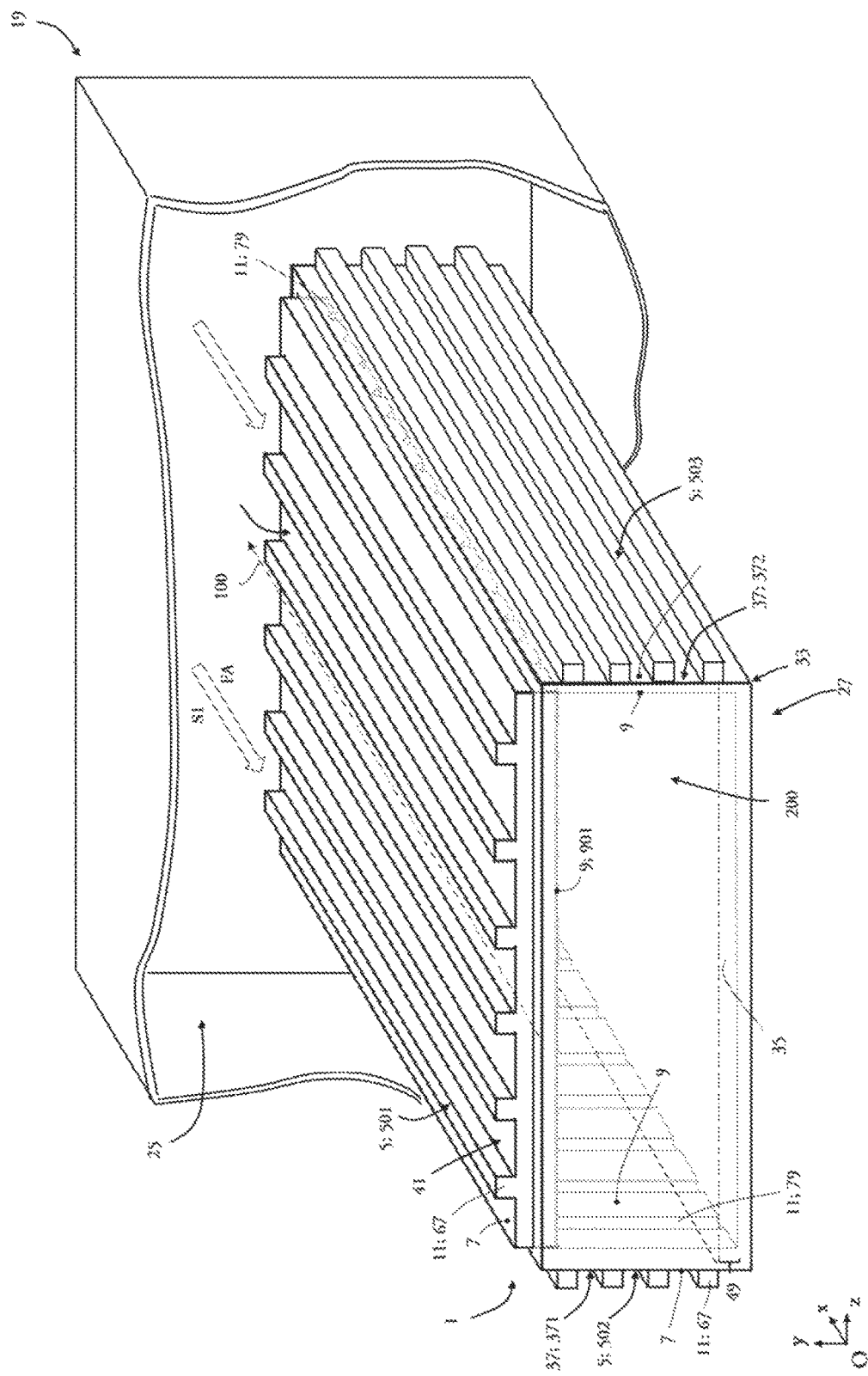
[Fig 5]

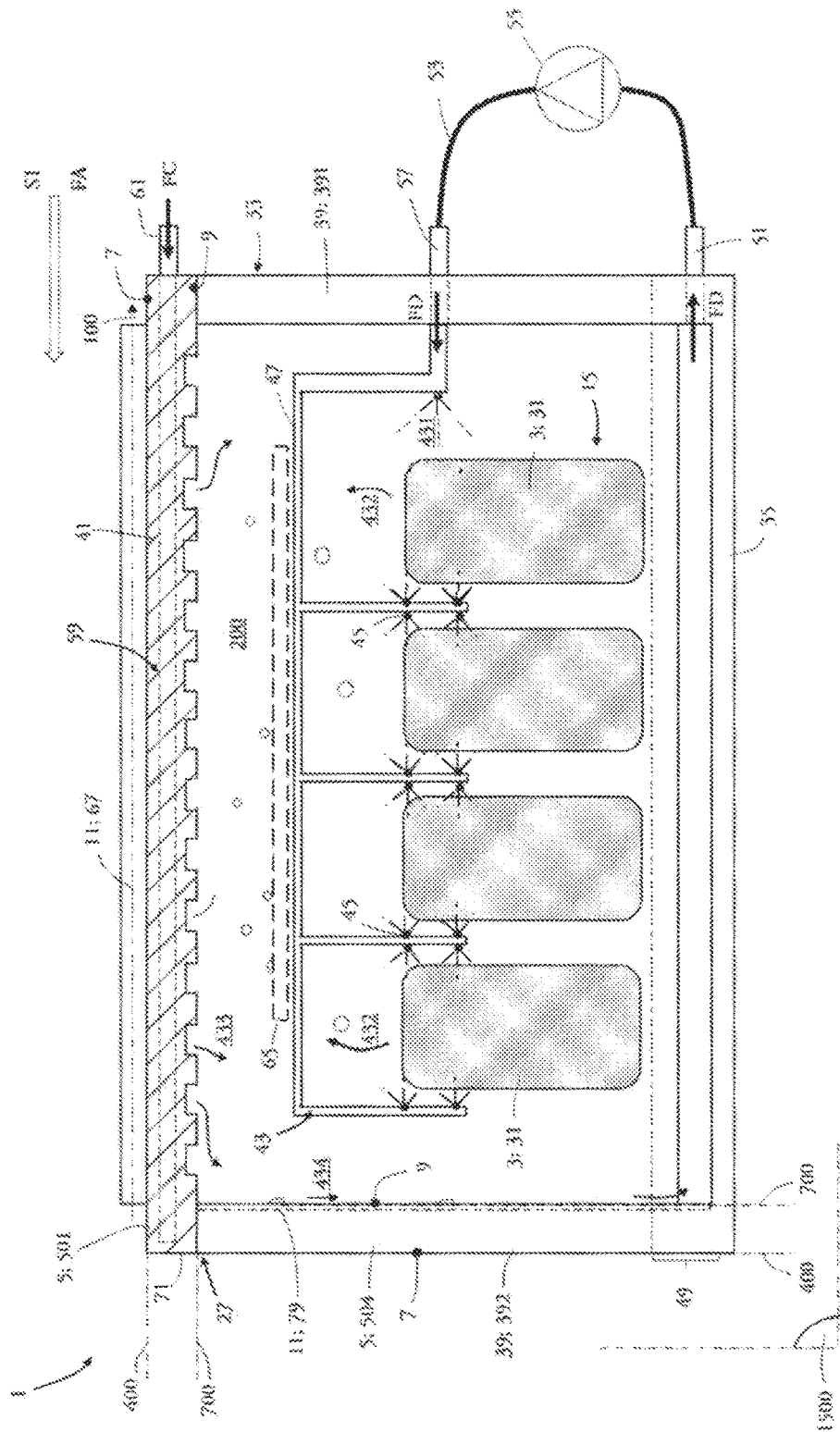
[Fig 6]

DEVICE FOR THERMALLY REGULATING AN ELECTRICAL COMPONENT

The present invention lies in the field of devices for thermally regulating electronic systems comprising electrical or electronic components that are liable to heat up during their operation.

The electronic systems to which the present invention can relate may consist equally of computer servers and electrical energy storage systems, in particular battery elements, for motor vehicles.

In the field of motor vehicles, thermal regulation devices make it possible to modify a temperature of an electrical energy storage system, both when starting the vehicle in cold weather, by increasing its temperature for example, and when traveling or during an operation of charging of said system, by decreasing the temperature of the battery elements, which tend to heat up when they are being used.

In general, such devices for thermally regulating electrical energy storage systems make use of heat exchangers. The different battery elements of an electrical energy storage system can in particular be cooled by means of a cold plate inside which a cooling fluid circulates, the plate being in contact with the battery elements to be cooled. It has been found that such heat exchangers can lead to non-uniform cooling of the battery elements of one and the same electrical energy storage system, thereby giving rise to a decrease in the overall performance of said system. These thermal regulation devices also exhibit high thermal resistance on account of the thicknesses of material present between the cooling fluid and the battery elements.

In order to provide a response to these different problems, a plurality of devices are known.

In particular, devices for cooling electric battery elements of electric or hybrid cars are known, comprising a hermetically sealed housing in which the battery elements of the electrical energy storage system are partially immersed in a dielectric fluid. This ensures heat exchange between the battery elements and the dielectric fluid, a dielectric fluid tank being situated outside the housing and connected to said housing in order to allow the circulation of the dielectric fluid.

However, the immersion of the electric battery elements in a fluid, in particular a dielectric fluid, does not allow uniform cooling of said elements. The document FR3077683 discloses a device for cooling battery elements, which also has a hermetic housing in which a dielectric fluid is disposed, but in which the dielectric fluid is sprayed onto the battery elements via a circuit and appropriate spraying means. When in contact with the battery elements that have heated up during their operation, the sprayed dielectric fluid tends to vaporize, and the vapor propagates through the housing and in particular along the walls delimiting the housing. The document FR3077683 discloses the presence of a condensation wall, comprising within it a refrigerant circuit, the wall being what is known as a condensation wall in that the temperature of this wall makes it possible to condense the vapor, such that the dielectric fluid returns to a liquid form.

It should be understood that the more the battery elements release heat, the more the condensation wall needs to be cooled to ensure that the previously vaporized dielectric fluid returns to the liquid state on contact with said elements. Motor vehicle manufacturers and motor vehicle equipment manufacturers are seeking to provide solutions for rapidly charging the electrical energy storage systems of their vehicles, in particular to allow them to be fully charged in a time of around 10 to 20 minutes. These operations, referred to as "fast charge" operations, thus bring about significant releases of heat by the battery elements. The substantial introduction of refrigerant, that is to say the high frequency at which the refrigerant needs to be evacuated from the housing with the heat energy that has been picked up and to be reintroduced into the housing in order to pick up further heat energy, consumes energy. Furthermore, it is possible for the presence of refrigerant not to be sufficient for the cooling rendered necessary by the fast charge operation.

The objective of the invention is to provide an alternative for thermal regulation of electronic systems, whether these are computer servers, electrical energy storage systems of motor vehicles or any other type of system having electrical or electronic components that are liable to heat up during their operation or while they are being charged, by proposing a thermal regulation assembly which is able to bring the electrical component to the desired temperature in a defined time.

In this context, the present invention relates to a device for thermally regulating an electrical or electronic component, the temperature of which needs to be regulated, said electrical or electronic component being liable to release heat during its operation and/or while it is being charged, the thermal regulation device having a housing that extends along a longitudinal axis and is configured to accommodate at least the electrical or electronic component, a circuit for a dielectric fluid and a device for spraying said dielectric fluid onto the electrical or electronic component, characterized in that the phase-change temperature of the dielectric fluid is such that it is able to vaporize on contact with the electrical or electronic component, in that the housing has at least one wall for condensation of the dielectric fluid in its vaporized form, and in that at least one external face and/or internal face of the at least one condensation wall of the housing has at least reliefs configured to promote the condensation of the dielectric fluid in the vaporized state.

Likewise, the housing may have, in a lower portion, a collecting tray for collecting the dielectric fluid in the liquid state.

"Reliefs" are understood to be shapes protruding or recessed from a first plane in which the external face of the condensation plane is substantially inscribed, or from a second plane in which the internal face of the condensation wall is substantially inscribed. Such reliefs may make it possible to increase the heat exchange surface area of the corresponding face of the condensation wall with a flow of outside air making it possible to cool the condensation wall and/or to allow the guidance along the corresponding face of a fluid involved in cooling the condensation wall and/or to allow the evacuation of the condensed dielectric fluid to allow the vaporized form of the fluid to be in contact with the corresponding face of the condensation wall.

In other words, the thermal regulation device seeks to optimize the condensation performance of the at least one condensation wall of the housing so as to improve the thermal regulation of the electrical or electronic components.

According to a first embodiment of the invention, at least a part of the reliefs consists of a plurality of guide members for guiding an air flow outside the housing, the guide members protruding from at least a first plane comprising substantially the external face of the condensation wall.

In other words, the guide members consist of ribs protruding from the condensation wall toward the outside of the housing. The guide members thus help to increase the surface area of the external face and therefore the heat exchange surface area between the condensation wall and the air flow outside the housing.

In particular, the adjacent guide members delimit a passage for the circulation of the air flow outside the housing.

According to the invention, the guide members extend parallel to the longitudinal axis of extension of the housing.

The guide members thus have a substantially rectilinear structure. Likewise, the guide members extend parallel to one another within one and the same condensation wall. These guide members are in particular configured to extend parallel to a main direction of circulation of the air flow outside the housing.

The guide members may have a profile of variable shape, for example a square, rectangular, triangular, or trapezoidal shape.

Particularly, the guide members may extend along the entire length of the condensation wall, said length being measured along the longitudinal axis of extension of the housing.

According to a second embodiment of the invention, at least a part of the reliefs consists of a plurality of evacuation members that are recessed from a second plane comprising substantially the internal face of the condensation wall, a depth of the evacuation members being less than a thickness of the condensation wall measured between the internal face and the external face.

In other words, the evacuation members extend between the first plane and the second plane. One of the main functions of these evacuation members is to allow, in particular by capillary action, the evacuation of the dielectric fluid that has condensed on contact with the condensation wall bearing these evacuation members. In other words, these evacuation members make it possible to clear the internal face of the condensation wall and to ensure that a liquid film does not remain on this condensation wall, which liquid film could prevent heat exchange between the dielectric fluid vapor which continues to be formed in contact with the operating electrical or electronic components and the condensation wall. These evacuation members may allow an increase in the area of thermal contact between the condensation wall and the vaporized dielectric fluid so as to promote the condensation of the latter.

The evacuation members may extend with different orientations. By way of example, a first subset of evacuation members may extend with the orientation, referred to below as the first orientation, substantially perpendicular to the longitudinal axis of extension of the housing, for example along a transverse direction or a vertical direction, while a second subset of evacuation members extends with a second orientation, substantially parallel to the longitudinal axis.

According to the invention, the evacuation members extend with at least one orientation, said orientation being substantially perpendicular to the longitudinal axis of extension of the housing.

According to the invention, the housing comprises the collecting tray for collecting the dielectric fluid in the liquid state, and at least one subset of evacuation members opens into the collecting tray.

In this configuration, at least a part of the evacuation members helps to promote the flow of the dielectric fluid that has condensed by contact with the condensation wall directly to the collecting tray.

According to a third embodiment, the thermal regulation device may comprise the guide members, disposed on the external face of the condensation wall, and the evacuation members, disposed on the internal face of this same condensation wall. In such an embodiment, the evacuation members may then extend perpendicularly to the guide members.

According to the invention and independently of the embodiment implemented, the housing comprises at least one base that is open on at least one side and comprises a bottom wall from which there protrude at least two side walls extending parallel to a longitudinal direction substantially parallel to the longitudinal axis and two longitudinal end walls delimiting the housing along the longitudinal direction, the housing comprising at least one cover configured to close the base and the at least one condensation wall being formed by the cover or a side wall or a longitudinal end wall of the base.

According to the invention, the thermal regulation device may comprise a plurality of condensation walls, the cover and/or at least one side wall and/or at least one longitudinal end wall of the base forming one of said condensation walls.

Advantageously, the cover and all of the side walls and/or longitudinal end walls of the base may form condensation walls.

It will be understood that, when the thermal regulation device comprises a plurality of condensation walls, these may be realized according to any one of the embodiments as set out above.

According to one particular embodiment, at least a part of the evacuation members comprised in a first condensation wall are fluidically connected at least a part of the condensation members comprised in at least one second condensation wall. This then forms continuity between the evacuation members of two subsets formed separately on adjacent walls. By way of example, the first condensation wall may be formed by the cover and the at least one second condensation wall may be formed by one of the side walls and/or one of the longitudinal end walls.

As was specified above, at least one subset of the evacuation members may open into the collecting tray. In the context of a plurality of subsets arranged respectively on one of the condensation walls, it is conceivable for at least a part of the evacuation members of the second condensation wall and/or at least a part of the evacuation members of the first condensation wall to open into the collecting tray, in particular when the subsets are arranged on side walls and/or longitudinal end walls. It is also conceivable in this context for a subset of evacuation members arranged in a condensation wall formed by the cover to communicate fluidically with the collecting tray via one or more subsets of evacuation members arranged on side walls and/or longitudinal end walls.

According to the invention and independently of the embodiment implemented, the thermal regulation device may comprise a circuit, referred to as the second circuit, for heat transfer fluid, which is separate from the dielectric fluid circuit, which is referred to below as the first circuit, the second, heat-transfer fluid circuit extending at least partially in a thickness of the condensation wall comprised between the internal face and the external face.

The heat transfer fluid may in particular consist of a refrigerant such as glycol water, R134a or 1234yf, or of carbon dioxide, this list not being limiting.

It should be noted that, in the present invention, the first circuit and the second circuit are separate, such that the dielectric fluid that circulates in the first circuit and the refrigerant that circulates in the second circuit do not mix.

Alternatively, the thermal regulation device may comprise a plate, accommodated in the housing, and the circuit, referred to as the second circuit, for heat transfer fluid which is separate from the dielectric fluid circuit, which is referred to below as the first circuit, the second, heat-transfer fluid circuit extending at least partially in the plate.

In particular the plate, which acts as a cold plate, may be configured so as to implement at least one exchange of heat between the refrigerant circulating in the second circuit and the dielectric fluid circulating in the first circuit.

The invention also relates to a thermal regulation assembly comprising at least one chamber, a ventilation device configured to draw an air flow from the chamber or to blow an air flow into the chamber, and a thermal regulation device as set out above, the chamber delimiting a circulation duct for the air flow in which the thermal regulation device extends, the thermal regulation device being disposed in the chamber such that the longitudinal axis of extension of the housing extends parallel to a direction of circulation of the air flow.

Further features, details and advantages of the invention will become more clearly apparent from reading the following description, and from a number of exemplary embodiments given by way of nonlimiting indication, with reference to the appended schematic drawings, in which:

FIG. 1 shows a vehicle equipped with a thermal regulation assembly comprising at least one thermal regulation device for an electrical or electronic component;

FIG. 2 shows a schematic perspective view of the thermal regulation device;

FIG. 3 shows a first schematic perspective view of a condensation wall of the thermal regulation device according to the invention;

FIG. 4 shown a second schematic perspective view of the condensation wall as illustrated in FIG. 3;

FIG. 5 is a schematic perspective view of the arrangement of the thermal regulation device in a chamber of the thermal regulation assembly;

FIG. 6 is a cross section of the thermal regulation device as illustrated in FIG. 2.

It should first of all be noted that the figures set out the invention in detail for implementing the invention, it being, of course, possible for said figures to serve to better define the invention if necessary.

The features, variants and different embodiments of the invention may be combined with one another, in various combinations, provided that they are not mutually incompatible or exclusive. In particular, variants of the invention may be envisaged that comprise only a selection of features that are described below in isolation from the other described features, if this selection of features is sufficient to provide a technical advantage or to differentiate the invention from the prior art. In the figures, elements that are common to several figures retain the same references.

Furthermore, with reference to the orientations and directions defined above, the longitudinal direction will be represented by the longitudinal axis X, while the vertical axis Y and transverse axis Z will represent the vertical and transverse directions, respectively. These axes together define a trihedron XYZ which is shown in the figures that require it. In this frame of reference, the terms "top" or "upper" will be represented by the positive direction of the vertical axis Y, the terms "bottom" or "lower" being represented by the negative direction of this same vertical axis Y.

As a reminder, the invention relates to a device 1 for thermally regulating an electronic component comprising electrical or electronic components 3, the temperature of which needs to be regulated, said electrical or electronic component 3 being liable to release heat during its operation. The thermal regulation device 1 according to the invention comprises particularly at least one condensation wall 5, an external face 7 and/or an internal face 9 of which has/have a plurality of reliefs 11. The invention also relates to a thermal regulation assembly 13 comprising said device 1.

The electronic systems to which the present invention can relate may consist equally of computer servers and electrical energy storage systems 15, in particular batteries, for motor vehicles. In the following detailed description, the thermal regulation device 1 will be described in relation to a motor vehicle electrical energy storage system 15, but it should be understood that such an application is not limiting and it could in particular be applied, in the context of the invention, to the different electronic systems.

FIG. 1 illustrates an electrical energy storage system 15 with which an electric or hybrid motor vehicle 17 can be equipped. Such an electrical energy storage system 15 is in particular intended to supply electrical energy to an electric motor, not shown, with which the motor vehicle 17 is equipped for the purpose of moving it.

As it operates, or while it is being charged, the electrical energy storage system 15 tends to heat up. Thus, the electrical energy storage system 15 is incorporated in the thermal regulation assembly 13 of the vehicle 17 in order, in particular, to be cooled. It should be noted that the thermal regulation assembly that will be described below could also consist of a system for increasing the operating temperature for the electrical storage system 15, for example when the vehicle is started.

The thermal regulation assembly 13 comprises at least one chamber 19, the thermal regulation device 1 and a ventilation device 18.

The chamber 19 is open toward a front face of the vehicle 17 at an air inlet 21 through an air flow FA, for example an air flow outside the vehicle 17, is able to enter in order to circulate in the chamber 19, and toward the rear of the vehicle 17 in the region of an air outlet 23. The chamber 19 thus delimits a circulation duct 25 for the air flow FA in which the thermal regulation device 1 comprising the electrical energy storage system 15 extends.

The ventilation device 18 is disposed in the chamber 19 and is configured to ensure the circulation of the air flow FA within said chamber 19. The ventilation device 18 may in particular consist of a fan or a blower. It may be disposed upstream, as illustrated, or downstream of the thermal regulation device 1 in a direction of circulation Si of the air flow FA in order to be able to respectively blow or draw the air flow through the circulation duct 25 delimited by the chamber 19.

As a result, when the vehicle 17 is in motion, the air flow FA enters the chamber 19 via the air inlet 21 and is brought into thermal contact with the thermal regulation device 1 in order to help in thermally treating the electrical energy storage system 15 accommodated in said device 1. Particularly, when the vehicle 17 is traveling at low speed, or when it is stopped, this being the case in particular during operations of fast charging the electrical energy storage systems, the air flow FA may be weak or even non-existent, such that the ventilation device 18 then feeds an air flow FA toward the chamber 19 or increases the flow rate of said air flow FA.

FIG. 2 schematically illustrates an exemplary embodiment of the thermal regulation device 1 according to the invention.

The thermal regulation device 1 has a housing 27 extending along a longitudinal axis 100 of extension and delimiting an internal volume 200 in which at least the electrical or electronic component 3 is accommodated. In the example illustrated, the housing 27 houses three components in the form of battery elements 31 of an electrical energy storage system 15, but it should nevertheless be understood that such a depiction is for indication only and that the number or form of the electrical or electronic components 3 disposed in the thermal regulation device 1 is in no way limiting. It will also be understood that other configurations of the electrical energy storage system 15 could be implemented according to the invention long provided that this system has a thermal regulation device 1 in accordance with the teachings of the invention.

The housing 27 comprises at least one base 33 that is open on at least one side, this base 33 comprising more particularly a bottom wall 35 from which there protrude vertically at least two side walls 37 extending longitudinally parallel to the longitudinal axis 100, and two longitudinal end walls 39 delimiting the housing 27 along the longitudinal axis X. The housing 27 also comprises at least one cover 41 configured to close the base 33. In particular, the cover 41 is arrange above the base 33 when the electrical energy storage system 15 is mounted on the vehicle 17.

The thermal regulation device 1 also comprises a circuit for a dielectric fluid FD, referred to below as the first circuit 43, and a device 45 for spraying said dielectric fluid in the direction of the battery elements 31 the temperature of which needs to be regulated. The spray device 45 may in particular consist of a plurality of spray nozzles, not shown here, which are arranged in the first circuit 43, each spray nozzle being capable of spraying and orienting the dielectric fluid in the liquid state onto the battery elements 31 in order to cool them where appropriate.

The first circuit 43 is arranged in the housing 27 in order to spray the dielectric fluid onto each of the battery elements 31, in particular onto separate flanks of said elements 31. Thus, as illustrated, the first circuit 43 may be provided in the internal volume 200 of the housing 27 so as to extend between one of the walls 37, 39, 42 of the housing 27 and one of the battery elements 31, or between two adjacent battery elements 31, as shown schematically in FIG. 6. The first, dielectric fluid circuit 43 is in this case formed by at least one tubular distribution pipe 47 protruding from the internal face 9 of the side walls 37 and/or the end walls 39. By way of example, the distribution pipe 47 may be made from a different material from that used to make the walls of the housing 27, for example of aluminum.

According to an alternative that is not shown, this distribution pipe 47 could, without departing from the context of the invention, be made in a thickness of at least any one of the walls 37, 39, 41 of the housing 27, measured between the internal face 9 and the external face 7 of the wall in question.

The dielectric fluid that is able to circulate in the first circuit 43 is chosen according to its phase change temperatures. More particularly, the dielectric fluid should be characterized at least by a phase change temperature such that this dielectric fluid, sprayed in the direction of the battery elements 31 in the liquid state, is able to be vaporized on contact with said battery elements 31. This is then said to be a two-phase dielectric fluid in that it has two different phases during its circulation in the thermal regulation device 1. By way of example, the dielectric fluid should have an evaporation temperature at atmospheric pressure that is higher than a temperature of around 32-34° C., and a condensation temperature that is lower than a temperature of around 29-31° C.

The housing 27 of the thermal regulation device 1 has, as set out above, at least one condensation wall 5 configured to condense the dielectric fluid in its vaporized form. In other words, the condensation wall 5 is configured to implement at least one exchange of heat with the dielectric fluid in the gas state.

Likewise, the condensation wall 5 is configured to implement at least one exchange of heat with the air flow FA circulating in the chamber 19, outside the housing 27.

As will be described in more detail below, the condensation wall 5 comprises, on its external face 7 and/or its internal face 9, a plurality of reliefs 11, which are configured in particular to promote the condensation of the dielectric fluid in the vaporized state. Said reliefs 11 have microscopic dimensions, and so they are not visible in the present figure. The reliefs 11 and their arrangement within the condensation wall 5 will be described further below with reference to FIGS. 3 to 5.

According to the invention, the condensation wall 5 may be formed by the cover 41, as illustrated in the present case, or by one of the side walls 37 or by one of the longitudinal end walls 39 of the base 33.

Likewise, the thermal regulation device 1 may comprise a plurality of condensation walls 5, the cover 41 and/or at least one of the side walls and/or at least one longitudinal end wall of the base 33 then being able to form one of said condensation walls 5. Advantageously, the cover 41 and all of the side walls 37 and/or end walls 39 of the base 33 may form condensation walls 5 for the vaporized dielectric fluid.

The housing 27 comprises at least one collecting tray 49, depicted here by way of dashed lines, which is intended to collect the dielectric fluid in the liquid state, whether this is the dielectric fluid directly exiting one of the spray devices 45 or dielectric fluid condensed by the condensation wall or walls after it has been vaporized. The collecting tray 49 is disposed in a lower portion of the base 33 and may be partially delimited by the bottom wall 35 or fitted in the base 33 of the housing 27.

The collecting tray 49 is provided with an evacuation hose 51 for the dielectric fluid collected inside the collecting tray 49, the evacuation hose 51 being in fluidic communication with a recirculation pipe 53 for the dielectric fluid. The recirculation pipe 53 is equipped with a member for setting the dielectric fluid in circulation, such as a pump 55, in order to return the dielectric fluid to a dielectric fluid inlet 57 in the housing 27 and then toward the distribution pipe 47 of the first circuit 43. It will be understood that such an inlet 57 and evacuation hose 51 for the dielectric fluid FD can, without departing from the context of the invention, be provided in any one of the walls 37, 38 of the base 33 of the housing 27.

Alternatively, the pump 55 and the recirculation pipe 53 could be provided in the internal volume 200 of the housing 27.

Lastly, the thermal regulation device 1 may comprise a second circuit 59, separate from the first, dielectric fluid circuit 43, configured to allow the circulation of a heat transfer fluid FC. The second, heat-transfer fluid circuit 59 is provided in particular to bring the condensation wall to a temperature promoting the condensation of the vaporized dielectric fluid by this condensation wall.

The second, heat-transfer fluid circuit 59 may extend at least partially in at least any one of the walls 37, 39, 41 of the housing 27 and it may more particularly be comprised in the condensation wall 5. It thus extends at least partially in a thickness 300 of the condensation wall 5, comprised between the internal face 9 and the external face 7 of said condensation wall 5, formed here by the cover 41.

The circulation of the heat transfer fluid FC in the second circuit 59 is ensured by a heat-transfer fluid inlet 61 and a heat-transfer fluid outlet 63, each in fluidic communication with the second circuit 59. The second circuit 59 schematically depicted by dashed lines here and has a serpentine shape extending between the heat-transfer fluid inlet and outlet, so as to allow the entire surface of the wall that comprises it, in this case the cover 41, to be cooled and, consequently, to allow effective cooling of the dielectric fluid in the gas state over the entire surface of the wall, in this case of the cover.

Alternatively, as can be seen by way of dashed lines in FIG. 6, the thermal regulation device 1 may comprise a plate 65, acting as a cold plate, accommodated in the housing 27. The second, heat-transfer fluid circuit 59 then extends at least partially in the plate 65. In such an alternative, the plate 65 may form the condensation wall 5 or act as a condenser for the dielectric fluid in a complementary manner to the at least one condensation wall 5.

It will thus be understood that the thermal regulation device 1 may be configured to comprise a single circuit, the first, dielectric fluid circuit 43, or two separate circuits, the first, dielectric fluid circuit 43 and the second, heat-transfer fluid circuit 59.

In each of these cases, the air flow FA circulating along the housing on the outside of the latter helps to reduce the temperature, or at the very least to suppress the rise in temperature, of the wall along which the air flow circulates, and this temperature regulation makes it easier for the dielectric fluid liable to be in the form of vapor to condense along this wall inside the housing.

FIGS. 3 to 5 illustrate the condensation wall 5 in more detail, whether this consists of the cover, one of the side walls or one of the longitudinal end walls of the housing. FIG. 3 reveals the external face 7 of said wall while FIG. 4 shows the internal face 9, facing the internal volume 200 of the housing 27, of the condensation wall 5. FIG. 5 illustrates the arrangement of the thermal regulation device 1 in the chamber 19 and more particularly the positioning of the reliefs 11 relative to the air flow FA circulating in the circulation duct 25 defined by the chamber 19.

It will be understood that, in the figures described below, the scale of the various reliefs 11 has been increased for clarity reasons, and so the dimensions of the various reliefs 11 shown here are not representative of reality.

A part of the reliefs 11 may consist of a plurality of guide members 67 for guiding the air flow FA outside the housing 27. The guide members 67 protrude from the condensation wall 5 and extend outside the housing 27, protruding from a first plane 400 in which the external face 7 is substantially inscribed. They thus contribute to increasing the heat exchange surface area of the external face 7 such that the heat energy collected from the vaporized dielectric fluid that is liable to be in contact with the internal face 9 can be evacuated more rapidly to the outside of the housing.

The guide members 67 have a elongate, substantially rectilinear structure. They extend parallel to the longitudinal axis 100 of extension of the housing 27 and parallel to one another. When the thermal regulation device 1 is positioned in the chamber 19, it is disposed such that the longitudinal axis 100 of extension of the housing 27 extends parallel to the direction of circulation Si of the air flow FA. In other words, the guide members 67 of the external face 7 extend substantially parallel to the direction of circulation Si of the air flow FA.

As a result, two adjacent guide member 67 define a circulation passage 69 for the air flow FA outside the housing 27 in contact with the external face 7 of the condensation wall 5. In particular, this air flow FA can be drawn or sucked through said circulation passages 69 by the ventilation device, which is not shown here and can be seen in FIG. 1.

In the example illustrated, the guide members 67 extend along the entire extension length 510 of the condensation wall 5, said length being measured along the longitudinal direction Ox between the end edges 71 longitudinally delimiting said wall.

The guide members 67 may have profiles of variable shape, examples of which are illustrated in the insert 1000. In particular, the guide members 67 may have, in a nonlimiting manner, a square, rectangular, triangular, or trapezoidal shape. Each guide member 67 is characterized by a shape height 670 and by a shape width 680. The shape height 670 is measured along the vertical axis Y, perpendicularly to the external face 7, between the first plane 400 and the free end 73 of the guide member 67. The shape width 680 is measured, on the first plane 400 and along the transverse axis Z, as the distance between two farthest apart extreme points of a base 75 of the guide member 67. By way of example, the shape height 670 and the shape width 680 may be around 0.2 to 0.5 millimeters.

Likewise, the adjacent guide member 67 are separated by a defined spacing 650, such a spacing 650 defining a width of the circulation passage 69 for the air flow FA. The spacing 650 between adjacent guide members 67 is measured on the first plane 400, along the transverse axis Z, between two closest points of the bases 75 of each of said guide members 67.

Particularly, the guide members 67 may be arranged regularly in the condensation wall 5 so as to have identical spacings 650 throughout said wall. Likewise, the spacing 650 measured between adjacent guide members 67 may have a value substantially equal to the value of the shape width 680 of the guide members 67. In the example illustrated, the guide members 67 are thus disposed regularly over the entire extension width 520 of the condensation wall 5 measured along the transverse axis Z between two lateral edges 77 of said wall.

FIG. 4 reveals more particularly a characteristic according to which a part of the reliefs 11 of the condensation wall 5 may consist of a plurality of evacuation members 79 that are recessed from a second plane 700 comprising substantially the internal face 9 of the condensation wall 5. In other words, these evacuation members extend at least partially between the first plane 400 and the second plane 700. While they also contribute to increasing the heat exchange surface area of the internal face 9, it is especially noteworthy that these evacuation members make it possible to clear, by capillary action, the dielectric fluid returning to its liquid form under the effect of the exchange of heat with the condensation wall. The dielectric fluid in the liquid state is thus quick to form a liquid film on the internal face of the wall and the evacuation members make it possible to clear this fluid in liquid form via the channels thus formed, at a distance from the internal face of the condensation wall 5.

In a similar way to the guide members 67, the evacuation members 79 have a substantially rectilinear elongate structure. The extend with an orientation substantially perpendicular to the longitudinal axis 100 of extension of the housing 27, parallel to one another.

Like the guide members 67, the evacuation members 79 may have profiles of variable shape, nonlimiting examples of which are illustrated in the insert 2000. In particular, the guide members 67 may have a square, rectangular, triangular, trapezoidal, or, as shown in the condensation wall 5, semicircular shape.

Each evacuation member 79 is characterized by a depth 790 less than the thickness 300 of the condensation wall 5. The depth 790 is measured vertically, that is to say perpendicularly to the internal face 9 of the condensation wall, between the second plane 700 and the bottom 81 of the evacuation member 79.

Each evacuation member 79 is characterized by a width, referred to as the structure width 795. The structure width 795 is measured on the second plane 700, in this case longitudinally, and corresponds to the distance between two farthest apart extreme points of an opening 83 in the guide member. By way of example, the structure depth 790 and the structure width 795 of the evacuation member 79 may be around 0.2 to 0.5 millimeters.

Likewise, adjacent evacuation members 79 are separated by a defined spacing 750. The spacing 750 between the adjacent evacuation members 79 is measured in particular on the second plane 700, perpendicularly to the evacuation members, i.e. in this case longitudinally, between the openings 83 of said members 79. Particularly, in the example illustrated, the evacuation members 79 are arranged regularly in the condensation wall 5 so as to exhibit identical spacings 750 throughout said wall. The spacing measured 750 may have a value substantially equal to the structure width 795 of the evacuation member 79. In particular, the evacuation members 79 may be regularly disposed along the entire extension length 510 of the condensation wall 5.

The condensation wall 5 may thus may produced according to three embodiments. According to a first embodiment, all the reliefs 11 on the condensation wall 5 are guide members 67 as mentioned above, and these reliefs have the function of increasing the heat exchange surface area of the condensation wall 5 with a flow of outside are passing along the external face of this condensation wall, so as to cool the condensation wall in order to promote the condensation of the dielectric fluid that has just been vaporized and which tends to be deposited on the internal face of this condensation wall.

According to the second embodiment, all the reliefs 11 on the condensation wall 5 are evacuation members 79 as mentioned above, and these reliefs have the main function of allowing the evacuation of the dielectric fluid once it has become liquid again, so as to clear the internal face and promote the condensation of the dielectric fluid that has just been vaporized and which tends to be deposited on the internal face of this condensation wall.

According to the third embodiment, shown more particularly in FIGS. 3 to 5, one part of the reliefs 11 on the condensation wall 5 consists of guide members 67 and the other part consists of evacuation members 79, making it possible to combine the two effects described above and thus to greatly improve the condensation performance of the dielectric fluid and, consequently, the cooling performance of the electrical or electronic components. In this third embodiment, and as can be seen in FIGS. 3 to 5, the evacuation members 79 extending with the orientation perpendicular to the axis of extension of the housing also extend perpendicularly to the guide members 67.

It will be understood that, as set out above, the condensation wall wall 5 may also at least partially comprise the second, heat-transfer fluid circuit 59, not shown here, specifically independently of the embodiment implemented.

As set out above, the thermal regulation device 1 may comprise a plurality of condensation walls 5. These different condensation walls 5 may then be produced according to any one of the embodiments. The thermal regulation device 1 could thus comprise one or more condensation wall(s) formed by the cover 41 and/or by at least one of the side walls 37 and/or at least one of the longitudinal end walls 39, each of these condensation walls 5 being able to implement the first, the second or the third embodiment and each of these condensation walls 5 being able or not being able to comprise the second, heat-transfer fluid circuit 59. FIGS. 5 and 6 illustrate, by way of nonlimiting indication, an exemplary embodiment of such a thermal regulation device 1, FIG. 6 illustrating a longitudinal section of said device made along a plane 1500, as shown in FIG. 2, comprising the longitudinal axis 100.

In the example illustrated in FIGS. 5 and 6, a first condensation wall 501 is formed by the cover 41. This first condensation wall 501 is produced according to the third embodiment and comprises guide members 67 for guiding the air flow FA, and evacuation members 79, which are visible by transparency in FIG. 5 and shown schematically in cross section in FIG. 6. Particularly, the cover 41 comprises the second, heat-transfer fluid circuit 59.

A second condensation wall 502 is formed by one of the side walls 37 of the housing 27, referred to below as the first side wall 371, also implementing the third embodiment, while a third condensation wall 503, formed by a second side wall 372, implements the first embodiment and does not have an evacuation member 79.

Lastly, in the example illustrated, one of the longitudinal end walls 39, referred to below as the first end wall 391, comprises the different dielectric fluid inlet 57 and evacuation hose 51 while a second longitudinal end wall 392 forms a fourth condensation wall 504 implementing the second embodiment, meaning that it does not have guide members 67 for guiding the air flow FA.

As mentioned above, the dielectric fluid is conveyed into the housing 27 via the dielectric fluid inlet 57. It is then sent into the distribution pipe 47 of the first circuit 43 and then sprayed in the form of liquid onto the different battery elements 31 by way of the spray devices 45, as depicted schematically by the sprays 431. The dielectric fluid captures heat energy given off by the battery elements 31 and at least a part of said sprayed fluid is vaporized under the effect of the temperature to be regulated. The vaporized dielectric fluid, depicted here by way of the arrows 432, then spreads in the gas state in the internal volume 200 of the housing.

The dielectric fluid thus vaporized can then come into contact with the internal face 9 of at least one of the condensation walls 5. For example, the vaporized dielectric fluid can come into contact with a first internal face 901 of the first condensation wall 501, formed by the cover 41.

In the example illustrated, the cover 41 comprises the second circuit 59, in which heat transfer fluid circulates. This heat transfer fluid FC makes it possible, in a complementary manner to the action of the air flow FA outside the housing 27 and passing along the external face of the condensation wall, to keep this condensation wall at a temperature lower than that of the vaporized dielectric fluid. Thus, when the vaporized dielectric fluid comes into contact with the cover 41, which is colder, it gives up heat energy by convection to the heat transfer fluid circulating in the second circuit 59 and passes into the liquid state. Thus, the heat transfer fluid present in the second circuit 59 has the main role of collecting, by convection, heat energy from the dielectric fluid in the gas state.

It will be understood that, depending on the amount of heat energy to be evacuated, and therefore depending on the mode of operation or charging of the battery elements, the thermal regulation device can be configured in an operating mode in which the heat transfer fluid circulates in the condensation wall and in which an air flow FA is forced along the external face of this condensation wall, or in an operating mode in which no heat transfer fluid circulates in the wall. Such an operating mode, implemented when the circulation of the flow of outside air is sufficient to evacuate the heat energy produced, makes it possible to save on the energy used to make the heat transfer fluid circulate.

Once in a liquid form, the dielectric fluid drops, as illustrated by the arrows 433, in the form of droplets, by gravity into the collecting tray 49 in the base 33 of the housing 27. Likewise, the evacuation members 79 of the cover 41, extending with an orientation perpendicular to the longitudinal axis 100 of the housing 27, contribute to evacuating, by capillary action, the dielectric fluid that has condensed on the first internal face 901 toward the side walls 37 of the base 33, this evacuation being illustrated by the arrows 434. Such an arrangement thus prevents the formation of a film of liquid dielectric fluid along the internal face 9 of the condensation wall 5. In a thermal regulation procedure in which the dielectric fluid is sprayed continuously onto the electrical or electronic components, the advantage will be understood of evacuating a liquid film from the internal face of the condensation wall in order that the newly vaporized fluid can come into contact with the condensation wall and be condensed in turn.

Advantageously, at least a part of the evacuation members 79 comprised in the first condensation wall 501, that is to say in the cover 41, can be fluidically connected to at least a part of the evacuation members 79 comprised in at least the second condensation wall 502 and/or in the third condensation wall 503 and/or in the fourth condensation wall 504. In this instance, the evacuation members 79 comprised in the first wall 501 are fluidically connected to at least a part of the evacuation member 79 of the second wall 502, i.e. the first side wall 371, and to at least a part of the evacuation members 79 comprised in the third condensation wall 503, i.e. the second side wall 372.

Furthermore, at least a part of the evacuation members 79 comprised in the second condensation wall 502 and in the third condensation wall 503 can open into the collecting tray 49 such that the evacuation members 79 of the cover 41 are fluidically connected to the collecting tray 49.

According to an alternative embodiment, which is not shown, the evacuation members 79 may be oriented with different orientations. By way of example, a first subset of evacuation members 79 may extend with the orientation, referred to below as the first orientation, substantially perpendicular to the longitudinal axis 100 so as to evacuate the liquid dielectric fluid toward the side walls 37, while a second subset of evacuation members 79 extends with a second orientation, substantially parallel to the longitudinal axis 100 so as to evacuate the dielectric fluid toward the longitudinal end walls 39.

In a similar way to the cover 41, the second, third and fourth condensation walls 502, 503, 504 formed by the side walls 37 and the second longitudinal end wall 392 contribute to promoting the condensation of the vaporized dielectric fluid in the internal volume 200 by way of the reliefs 11 that are specific to them.

At the first side wall 371 and the second longitudinal end wall 392, the dielectric fluid thus liquefied on contact with the condensation walls 5 drips by gravity along the internal faces 9 of said walls 5 as far as the collecting tray 49, partially delimited by the bottom wall 35, and is then evacuated from the housing 27 via the evacuation hose 51.

At least one subset of the evacuation members 79 may open into the collecting tray 49. In the example illustrated, this is the case for the evacuation members 79 comprised in the second condensation wall 502, that is to say in the first side wall 371 of the base 33, as illustrated in FIG. 5, and for the evacuation members 79 comprised in the fourth condensation wall 504, that is to say the second longitudinal end wall 392, as depicted schematically by dashed lines in FIG. 6.

It should be noted that, in the example illustrated, the first longitudinal end wall 391 is a simple wall, meaning that it does not form a condensation wall 5 and does not comprise reliefs 11 configured to promote the condensation of the vaporized dielectric fluid. The first end wall 391 could nevertheless form a condensation wall 5 and, by way of example, comprise evacuation members 79.

It will thus be understood that the dielectric fluid travels through a circulation loop comprising the collecting tray 49 for collecting the dielectric fluid in the liquid state, the dielectric fluid recirculation pipe 53 equipped with the pump 55, the first dielectric fluid circuit 43, which extends in the housing 27, the spray devices 45 spraying the battery elements 31 with dielectric fluid which vaporized on contact therewith and then liquefied on contact with one of the condensation walls 5 in order to drip by gravity into the collecting tray 49 and/or to be evacuated along the internal faces 9 of the side walls 37 or end walls 39.

Alternatively, the thermal regulation device 1 may comprise a plate 65, or cold plate, depicted here by dashed lines, which extends in the internal volume 200 of the housing 27 and at least partially comprises the second, heat-transfer fluid circuit 59. By way of example, the plate 65 may extend next to one of the condensation walls 5, next to one of the walls 37, 39, 41 of the housing 27 or between adjacent battery elements 31. Likewise, the thermal regulation device 1 may comprise a plurality of plates 65.

The plate 65 thus acts as a condenser for the vaporized dielectric fluid. In a similar way to what is set out above, when the second circuit 59 is comprised in one of the condensation walls 5, the heat transfer fluid, which is colder, captures the heat energy from the dielectric fluid, which liquefies and then drips toward the collecting tray 49 of the housing 27. In parallel, the condensation walls 5, as set out above, may be involved in the condensation of the dielectric fluid in the gas state by implementing heat exchange between said fluid and the air flow FA outside the housing 27.

It will be understood from reading the above that the present invention provides a thermal regulation assembly comprising at least one device for thermally regulating at least one electrical or electronic component, the temperature of which needs to be regulated, said electrical component being liable to release heat during its operation. The thermal regulation device thus comprises a housing and a circuit for a dielectric fluid intended to be sprayed onto the electrical component, the dielectric fluid being able to be vaporized by contact with said component. The thermal regulation device according to the invention comprises at least one condensation wall for condensing said vaporized dielectric fluid, an external face and/or an internal face of which has/have a plurality of reliefs configured to promote the condensation of the dielectric fluid. Regardless of the shape of the reliefs, it should in fact be noted that the condensation of the dielectric fluid is promoted both by an increase in an exchange surface area, which allows better cooling of the wall capable of condensing the dielectric fluid and by the presence of microscopic channels which allow the evacuation of the dielectric fluid in the form of liquid and which promote the condensation of the fluid which has just been vaporized, allowing it to take the place, along the condensation wall, of the dielectric fluid that has already condensed.

The invention is not, however, limited to the means and configurations described and illustrated here, but also extends to any equivalent means or configuration and to any technically operational combination of such means. In particular, the number of condensation walls, the walls forming said condensation walls, the presence of a heat-transfer fluid circuit and the size or shapes of the reliefs could be modified without having an adverse effect on the invention, provided that the thermal regulating device ultimately fulfills the same functionalities as those described in the present document.

The invention claimed is:

1. A device for thermally regulating an electrical component, the temperature of which needs to be regulated, said electrical or electronic component being liable to release heat during its operation, the thermal regulation device comprising:
   a housing that extends along a longitudinal axis and is configured to accommodate at least the electrical or electronic component;
   an air flow outside of the housing along the longitudinal axis;
   a circuit for a dielectric fluid;
   a device for spraying said dielectric fluid onto the electrical or electronic component, wherein the phase-change temperature of the dielectric fluid is such that it is able to vaporize on contact with the electrical or electronic component;
   a condensation wall, formed by a portion of the housing, having an internal face and an external face, wherein the condensation wall is configured to condense the dielectric fluid in its vaporized form using internal reliefs and external reliefs,
   wherein the internal reliefs protrude or are recessed from a plane in which the internal face of the condensation wall is inscribed and are configured to increase a heat exchange surface area of the internal face thereby optimizing a first heat transfer between the dielectric fluid in its vaporized form and the condensation wall, and
   wherein the external reliefs protrude or are recessed from a plane in which the external face of the condensation wall is inscribed and are configured to increase a heat exchange surface area of the external face thereby optimizing a second heat transfer between the condensation wall and the air flow outside of the housing.

2. The thermal regulation device as claimed in claim 1, wherein at least a part of the external reliefs consist of a plurality of guide members for guiding the air flow outside the housing, the guide members protruding from the plane in which the external face of the condensation wall is inscribed, wherein the guide members have an elongated, substantially rectilinear structure extending parallel to the longitudinal axis of the housing and parallel to one another, and wherein two adjacent guide members define a circulation passage for the air flow outside the housing in contact with the external face of the condensation wall to draw or suck the air flow through the circulation passages.

3. The thermal regulation device as claimed in claim 1, wherein at least a part of the internal reliefs consist of a plurality of evacuation members that are recessed from the plane in which the internal face of the condensation wall is inscribed, a depth of the evacuation members being less than a thickness of the condensation wall measured between the internal face and the external face.

4. The thermal regulation device as claimed in claim 3, wherein the evacuation members extend with at least one orientation, said orientation being substantially perpendicular to the longitudinal axis of extension of the housing.

5. The thermal regulation device as claimed in claim 3, wherein the housing comprises a collecting tray for collecting the dielectric fluid in the liquid state.

6. The thermal regulation device as claimed in claim 1, wherein the housing comprises at least one base that is open on at least one side and comprises a bottom wall from which there protrude at least two side walls extending parallel to a longitudinal direction substantially parallel to the longitudinal axis and two longitudinal end walls delimiting the housing along the longitudinal direction, the housing comprising at least one cover configured to close the base and the at least one condensation wall being formed by the cover or a side wall or a longitudinal end wall of the base.

7. The thermal regulation device as claimed in claim 6, comprising a plurality of condensation walls, the cover and/or at least one side wall and/or at least one longitudinal end wall of the base forming one of said condensation walls.

8. The thermal regulation device as claimed in claim 1, further comprising a circuit, referred to as the second circuit, for heat transfer fluid, which is separate from the dielectric fluid circuit, which is referred to below as the first circuit, the second, heat-transfer fluid circuit extending at least partially in a thickness of the condensation wall comprised between the internal face and the external face.

9. A thermal regulation assembly comprising:
   at least one chamber;
   a ventilation device configured to draw an air flow through the chamber or to blow an air flow into the chamber; and
   a thermal regulation device as claimed in claim 1, the chamber delimiting a circulation duct for the air flow in which the thermal regulation device extends, the thermal regulation device being disposed in the chamber such that the longitudinal axis of extension of the housing extends parallel to a direction of circulation of the air flow.

* * * * *